(12) United States Patent
Ning (10) Patent No.: US 7,442,330 B2
(45) Date of Patent: Oct. 28, 2008

(54) METHOD AND APPARATUS OF MANUFACTURING REFLECTOR

(75) Inventor: Chen Ning, Tochigi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 524 days.

(21) Appl. No.: 10/848,685

(22) Filed: May 19, 2004

(65) Prior Publication Data

US 2004/0241588 A1 Dec. 2, 2004

(30) Foreign Application Priority Data

May 27, 2003 (JP) ............... 2003-149392

(51) Int. Cl.
*B29D 11/00* (2006.01)
(52) U.S. Cl. .......... 264/1.38; 264/1.6; 264/1.9
(58) Field of Classification Search .......... 264/1.1, 264/1.6, 1.36, 1.38, 1.9; 425/808
See application file for complete search history.

(56) References Cited

U.S. PATENT DOCUMENTS 5,948,488 A * 9/1999 Marecki et al. .......... 428/30

FOREIGN PATENT DOCUMENTS

JP 8-54503 2/1996
JP 11-52110 2/1999

* cited by examiner

*Primary Examiner*—Mathieu D. Vargot
(74) *Attorney, Agent, or Firm*—Brinks Hofer Gilson & Lione

(57) ABSTRACT

A method and an apparatus of manufacturing a reflector which productivity is excellent, the photosensitive resin layer is not changed during the period from a transferring step to an ultraviolet ray irradiating step, and post-process such as a fine hole forming step is easily preformed are provided. The method of manufacturing the reflector comprising the steps of forming a photosensitive resin layer on a sheet base body; transferring a shape of prominence and depression onto the photosensitive resin layer, while forwarding the sheet base body in one direction, by rotating a transfer roller having substantially cylindrical shape while pressing the transfer roller against the photosensitive resin layer, wherein the transfer roller has a transfer surface having a prominence and depression pattern at the periphery thereof; and preliminarily irradiating ultraviolet ray onto the photosensitive resin layer immediately after the transferring step is employed.

5 Claims, 7 Drawing Sheets

METHOD AND APPARATUS OF MANUFACTURING REFLECTOR

This application claims the benefit of priority to Japanese Patent Application No. 2003-149392, herein incorporated by reference.

BACKGROUND OF THE INVENTION

1. Field of the Invention

The present invention relates to a method and an apparatus of manufacturing a reflector.

2. Description of the Related Art

In portable electronics such as a portable telephone or a portable game device, since the battery life extremely affects usability, a reflective-type liquid crystal display device having low power consumption has been employed as a display device. The reflective-type liquid crystal display device comprises a reflector for reflecting external light incident from the front surface thereof. In the construction thereof, it is known that the reflector is sandwiched between two substrates forming the liquid crystal panel, or the semi-transmissive reflector is positioned on the rear surface of a transmissive liquid crystal panel. As the semi-transmissive reflector, a reflector having fine holes for transmitting the light is known.

As a conventional reflector, the reflector having a plurality of concave portions formed therein is known, as described in the below Patent Document 1. In order to manufacture this reflector, as described in Japanese Unexamined Patent Application Publication No. 11-52110, a method of preparing a transfer plate and a resin base material made by forming a photosensitive resin layer on the plate, pressing the transfer plate against the photosensitive resin layer of the resin base material, and then irradiating ultraviolet rays thereto to cure the resin base material is employed.

On the other hand, as a means for applying a specific shape to the surface of the photosensitive resin on a flexible sheet, as described in Japanese Unexamined Patent Application Publication No. 8-54503, a method of sequentially transferring the shape of the transfer pattern by forming transfer pattern on the surface of a rotary roller and pressing the rotary roller against the photosensitive resin layer while rotating the rotary roller is known. In addition, in this method, by irradiating ultraviolet rays onto the portion where the rotary roller contacts the photosensitive resin, the transferring step and the resin curing step are simultaneously performed.

However, in the case of manufacturing the semi-transmissive reflector by the method of Patent Document 2, fine holes for transmitting light must be formed in the photosensitive resin. But, in the method of Patent Document 2, since the transferring step and the resin curing step are simultaneously performed such that the photosensitive resin is completely cured, it is difficult to form fine holes in the photosensitive resin after the transferring step. Accordingly, the method of Patent Document 2 is not suitable as the method of manufacturing the semi-transmissive reflector which requires further processing after the transferring step. Also, the rotary roller cannot be pressed against the inflexible base material sheet by a sufficient area, thereby decreasing productivity.

Accordingly, in the method of Patent Document 2, it is considered that the step of irradiating the ultraviolet rays onto the photosensitive resin layer may follow the transferring step and the fine hole forming step. However, since the photosensitive resin layer has relatively large flexibility, the transferred shape of the photosensitive resin may be naturally changed while forming the fine hole. Also, by performing the transferring step while rotating the rotary roller, points of time between the start and end portions of the sheet are different, thereby changing the time up to the ultraviolet ray irradiating step. Thereby, during irradiating the ultraviolet rays, the shape of the start portion of the sheet may be largely changed.

SUMMARY OF THE INVENTION

The present invention has been made in order to solve the above-mentioned problems, and it is an object of the present invention to provide a method and an apparatus of manufacturing the reflector in which the post-process such as the fine hole forming step can be easily performed, without naturally changing the photosensitive resin from the transferring step to the ultraviolet ray irradiating step.

To achieve this object, the present invention employs the structure described below.

The method of manufacturing a reflector according to the present invention comprises the steps of forming a photosensitive resin layer on a sheet base body; transferring the prominence and depression pattern onto the photosensitive resin layer, while forwarding the sheet base body in one direction, by rotating a transfer roller having substantially cylindrical shape while pressing the transfer roller against the photosensitive resin layer on the sheet base body, wherein the transfer roller has a transfer surface having the prominence and depression pattern at the periphery thereof; and preliminarily irradiating ultraviolet ray with respect to the photosensitive resin layer immediately after the transferring step. Also, it is preferable that the ultraviolet ray is main-irradiated with respect to the photosensitive resin layer after the preliminary irradiating step.

In addition, the method of manufacturing a reflector according to the present invention comprises the steps of forming a photosensitive resin layer onto a sheet base body; under the state of fixing the sheet base body, transferring the prominence and depression pattern onto the photosensitive resin layer by rotating a transfer roller having substantially cylindrical shape while pressing the transfer roller with respect to the photosensitive resin layer on the sheet base body, wherein the transfer roller has a transfer surface having the shape of prominence and depression at the periphery thereof; and preliminarily irradiating ultraviolet rays with respect to the photosensitive resin layer immediately after the transferring step are comprised.

Here, the transfer roller is dropped and the light ray for curing such as ultraviolet ray is switched on immediately after the transferring step. "Immediately after the transferring step" means a few seconds, at the most, after the point of time that the transfer surface of the transfer roller is released from the photosensitive resin layer. Also, the preliminary irradiation amount of the ultraviolet ray is preferably about 1 to 10% of the main irradiation amount.

In this way, by preliminarily irradiating the ultraviolet ray with respect to the photosensitive resin layer immediately after the transferring step, allow only the surface of the photosensitive resin layer to be cured, thereby preventing the photosensitive resin layer from being naturally changed during the interval between the preliminary irradiating step and the main irradiating step. Also, since the photosensitive resin layer is not completely cured, the post-process such as the step of forming fine holes for transmitting the light can be easily performed.

In addition, the method of manufacturing the reflector according to the present invention is characterized in that the preliminary irradiation amount of the ultraviolet rays does not exceed 30 mJ/cm$^2$ per unit area of the sheet base body.

Thereby, only the surface of the photosensitive resin layer can be cured, and thus the post-process for the photosensitive resin becomes easy.

Also, the method of manufacturing the reflector according to the present invention is characterized in that the preliminarily irradiating step is performed from the location spaced by 5 to 50 cm from the photosensitive resin layer toward the direction inclined by 0° to 50° with respect to the direction perpendicular to the direction of travel of the transfer roller. Thereby, the ultraviolet rays can be reach the photosensitive resin layer immediately after the transfer roller is released from the surface of the photosensitive resin layer, and thus the photosensitive resin layer can be prevented from being naturally changed.

Further, in the above-mentioned method of manufacturing the reflector according to the present invention, it is preferable that the photosensitive resin layer is composed of any one of acryl-based resist, polystyrene-based resist, azide rubber-based resist, and imide-based resist. By using these resists, only the surface of the photosensitive resin layer can be cured in the ultraviolet ray irradiation amount of less than or equal to 30 mJ/cm$^2$ per unit area, and thus the natural variation according to the elapsed time can be prevented.

In addition, the method of manufacturing the reflector according to the present invention further comprises the step of providing an antistatic layer to the photosensitive resin layer before the transferring step is further comprised. The antistatic layer is formed by adding conductive fine powders such as zinc oxide, antimony oxide and indium oxide to a resin matrix. Thereby, the electrostatic electrification in the photosensitive resin layer can be prevented.

Also, the apparatus of manufacturing reflector according to the present invention further comprises a base die for supporting a sheet base body having a photosensitive resin layer and carrying the sheet base body in one direction; a transfer roller having substantially cylindrical shape and being rotatably positioned apart from the base die; and an ultraviolet ray preliminary light source positioned on the downstream side in the direction of travel of the transfer roller, for preliminarily irradiating ultraviolet rays onto the sheet base body, and the periphery of the transfer roller is formed with a transfer surface and the transfer surface having a prominence and depression pattern is formed to be pressed against the photosensitive resin layer.

Furthermore, the apparatus of manufacturing reflector according to the present invention comprises a base die for supporting a sheet base body having a photosensitive resin layer accumulated thereon and carrying the sheet base body in one direction; a transfer roller having substantially cylindrical shape, being rotatably positioned apart from the base die, and being capable of being moved in one traveling direction; and an ultraviolet ray preliminary light source positioned on the downstream side in the direction of travel of the transfer roller, for preliminarily irradiating ultraviolet ray to the sheet base body, and the periphery of the transfer roller is formed with a transfer surface having the prominence and depression pattern and the transfer surface is formed so as to be pressed against the photosensitive resin layer. Thereby, only the surface of the photosensitive resin layer can be cured by preliminarily irradiating the ultraviolet rays onto the photosensitive resin layer immediately after the transferring step, and thus the photosensitive resin layer can be prevented from being changed after the preliminary irradiating step.

Also, the above-mentioned apparatus of manufacturing reflector is characterized in that the preliminary irradiation amount of the ultraviolet rays does not exceed 30 mJ/cm$^2$ per unit area of the photosensitive resin layer. Thereby, only the surface of the photosensitive resin layer can be cured, and thus the post-process for the photosensitive resin becomes easy.

Further, the above-mentioned apparatus of manufacturing reflector according to the present invention is characterized in that the ultraviolet ray preliminary light source is separated from the photosensitive resin layer by 5 to 50 cm, and the ultraviolet ray is preliminarily irradiated in the direction inclined by 0° to 50°, more preferably, 0° to 45° with respect to the direction perpendicular to the direction of travel of the transfer roller or the sheet base body. Thereby, the ultraviolet rays can reach the photosensitive resin layer immediately after the transfer roller is released from the surface of the photosensitive resin layer, and thus the photosensitive resin layer can be prevented from being naturally changed.

Also, if the established angle of the ultraviolet ray preliminary irradiating light source is less than 10°, interference with a prominence and depression pattern on the transfer roller is generated, which may damage the prominence and depression pattern. Also, if the angle is more than 45°, the light is leaked to the non-processed portion, and thus the hardness of the resin surface is changed.

In addition, the above-mentioned apparatus of manufacturing reflector according to the present invention is characterized in that the periphery of the transfer roller is an easily stripped surface. Thereby, when the transfer roller is released from the surface of the photosensitive resin layer, the photosensitive resin is clearly stripped from the transfer roller, and the photosensitive resin is not attached to the transfer roller.

The above-mentioned apparatus of manufacturing reflector according to present invention further comprises a light shield cover for covering the periphery of the transfer roller on the downstream side in the direction of travel of the transfer roller. Thereby, the ultraviolet rays emitted from the ultraviolet ray preliminary light source is not leaked to the upstream side of the direction of travel of the transfer roller, and thus the photosensitive resin can be prevented from being hardened before the transferring step.

The above-mentioned apparatus of manufacturing reflector according to the present invention is characterized in that the surface of the base die is an ultraviolet ray absorbing surface. Thereby, most of the irradiated ultraviolet rays are absorbed by the base die and are not reflected from the photosensitive resin again, and thus the excess hardening reaction due to the re-reflection of the ultraviolet rays can be prevented.

BRIEF DESCRIPTION OF THE DRAWINGS

FIG. 1 shows a sheet base body used in a method of manufacturing a reflector according to the present invention, wherein

FIG. 7 shows the shape of a concave portion formed in the reflector shown in FIGS. 5 and 6, wherein

DESCRIPTION OF THE PREFERRED EMBODIMENT

Hereinafter, embodiments of the present invention will now be described with reference to the drawings. In the method of manufacturing the reflector according to the present invention, a photosensitive resin is coated on a sheet base body to form a photosensitive resin layer, the transfer roller having a cylindrical shape is rotated and pressed against the photosensitive resin layer on the sheet base body while carrying the sheet base body in one direction, and the pattern of prominence and is transferred on the photosensitive resin layer. And, ultraviolet ray is preliminarily irradiated onto the photosensitive resin layer immediately after the transferring step, a predetermined post-process is performed, and then ultraviolet rays are main-irradiated to completely cure the photosensitive resin.

In the below description, the sheet base body, the transfer roller, and a reflector manufacturing device used in the method of manufacturing the reflector according to the present invention will be described in order, and then the method of manufacturing the reflector using the apparatus of manufacturing reflector will be described.

Figure 1A:
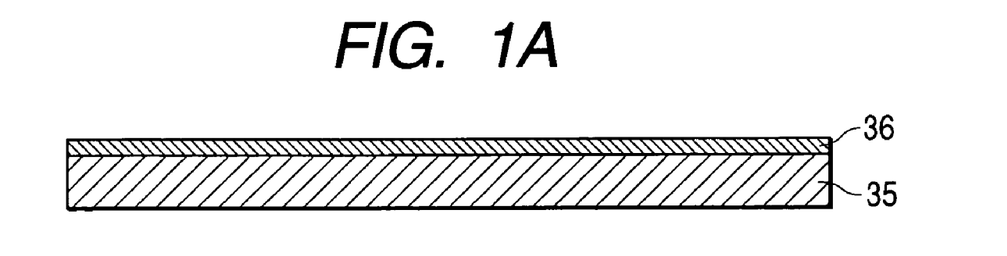
FIG. 1A is a cross-sectional view showing an example of laminating a photosensitive resin layer and FIG. 1B is a cross-sectional view showing an example of laminating a photosensitive resin layer and an antistatic layer.

FIG. 1A shows a sheet base body 35 used in the method of manufacturing the reflector. The sheet base body 35 is formed with a photosensitive resin layer 36. The sheet base body 35 is composed of any one of a glass substrate, a film such as PET, PE, and polycarbonate, or a plastic plate. Also, the photosensitive resin layer 36 is composed of any one of photosensitive resin such as acryl-based resist, polystyrene-based resist, azide rubber-based resist, and imide-based resist. Also, this photosensitive resin has excellent heat resistance and solvent resistance and thus is suitably used in the present embodiment. It is preferable that the film thickness of the photosensitive resin layer 36 is in the range of 1.5 to 5 μm. If the film thickness is less than 1.5 μm, the impression of the transfer pattern is not stably performed and the applied force is remarkably increased, thereby increasing the cost of the apparatus. Also, if the film thickness is more than 5 μm, the variation of the pattern becomes increased after applying the pattern or the resin is apt to cure unevenly during the preliminary curing step.

In order to form the photosensitive resin layer 36, the above-mentioned photosensitive resin is dissolved in solvent to form a photosensitive resin solution and the photosensitive resin solution is coated on the sheet base body 35 by a coating method such as a spin coat method and a screen printing method. Then, the sheet base body coated with the photosensitive resin solution is heated at a temperature 80 to 130° C. for 1 minute to 3 minutes by a heating device such as a heating furnace or a hot plate.

Figure 1B:
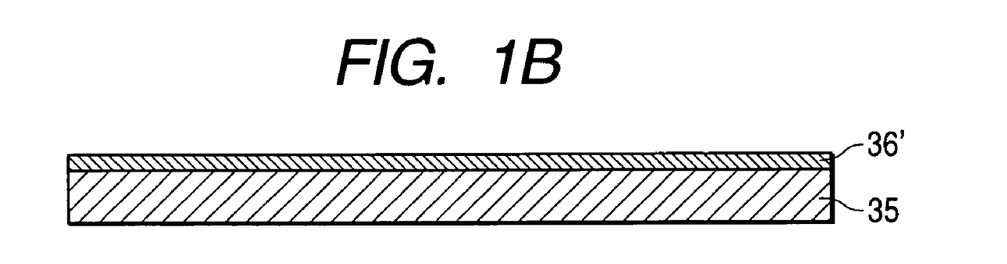

Also, as shown in FIG. 1B, the electrostatic charging may be applied to the photosensitive resin layer 36. The electrostatic charging is applied by mixing conductive fine particles with an average diameter of about 50 nm or less into the photosensitive resin matrix, and thus the resin layer 36' is formed. As the conductive fine particles, preferably zinc oxide, antimony oxide or indium oxide are used. These conductive fine particles are mixed in the range which does not deteriorate the light-hardenability, for example, in 0.1 to 5%, more preferably 1 to 5%, thereby reducing electrostatic charging amount.

Figure 2:
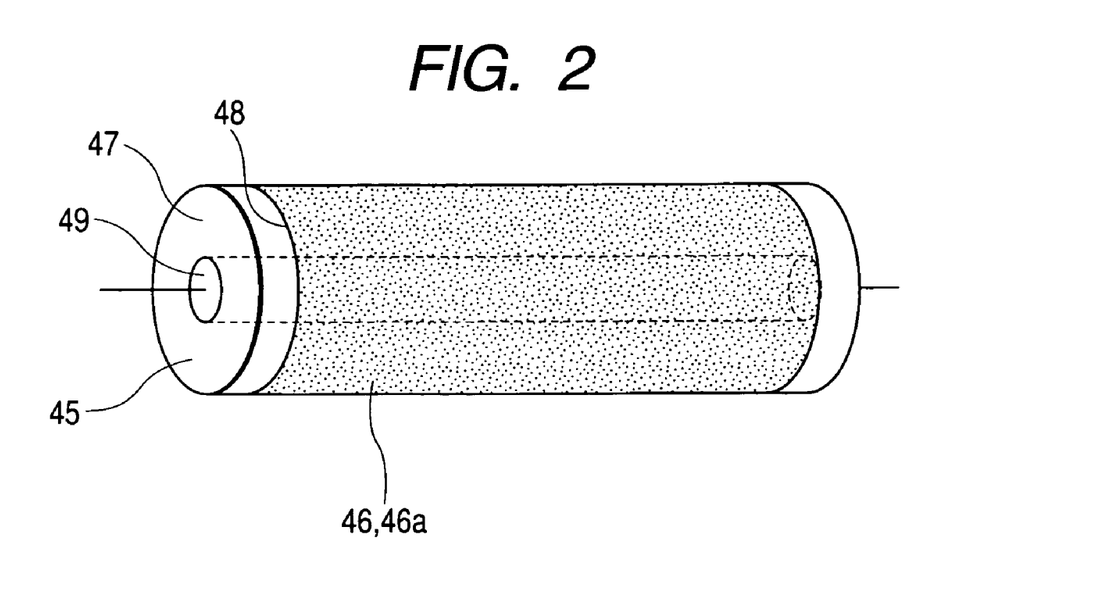
FIG. 2 is a perspective view showing a transfer roller used in the method of manufacturing the reflector according to the present invention.

FIG. 2 is a perspective view of a transfer roller used in the method of manufacturing the reflector according to the present embodiment. As shown in FIG. 2, the transfer roller 45 is a cylindrical-shaped member having a transfer surface 46a on which fine prominence and depression pattern are formed at the periphery thereof and comprises a rotary roller 47 having a rotating axis 49 and an electroforming mold 48 composed of Ni wound on the rotary roller 47. The surface of the electroforming mold 48 is formed with fine prominence and depression pattern as the above-mentioned transfer surface 46a. The pattern of the prominence and depression oppositely corresponds to that of the pattern prominence and depression of the photosensitive resin layer 36 after the transferring step.

In addition, the fine irregularity formed in the surface of the electroforming mold 48 includes a portion of the spherical surface at the outer surface thereof, and convex portions are arranged to be adjacent to each other. By using the electroforming mold 48 as the transfer mold, the structure which the contours of the concave portion of the reflector are adjacent to each other can be obtained, as described below.

Also, it is preferable that the transfer surface 46a of the transfer roller 45 becomes an easily stripped surface. Thereby, releasability of the transfer roller 45 from the photosensitive resin layer 36 or the antistatic layer 36' can be improved. In order to use the transfer surface 46 as an easily stripped surface, the surface of the electroforming mold 48 is reformed to a surface having low surface energy, for example, water repellency. As a means for reforming the surface, silane coupling solvent having fluorine structure or silane compound having Si structure is coated on the surface of the electroforming mold 48.

As a representative example of silane coupling solvent, there is silane coupling solvent ($C_8F_{17}C_2H_5Si(OC_2H_5)_3$) (made by Dow Corning Toray silicone Co., Ltd.). Also, as a representative example of silane compound, there are $CF_3CH_2Si(OMe)_3$ having fluorine structure, $CF_3Si(OCH_3)_3$ having silicon structure, $C_6H_{13}Si(OC_2H_5)_3$ having silicon structure, and $C_6H_3Si(OCH_3)_3$ having silicon structure (all made by Chisso Corporation)

In the case of coating with the silane coupling solvent or the silane compound, it is preferable that the silane coupling solvent or the silane compound is diluted by an alcoholic solvent or a mixture of alcoholic solvent and acetic acid ester-based solvent. The film thickness of the reformed film formed on the surface of the transfer surface 46a can be controlled in accordance with the added ratio of the silane coupling solvent (the silane compound) and the solvent.

The reformed film is formed on the surface of the transfer surface 46a by coating the solution consisting of the silane coupling solvent or the silane compound diluted by the solvent onto the surface of the transfer surface 46a by a dipping method, a spinner method or a spray method. Upon dipping, the film thickness of the reformed film is controlled in accordance with the added ratio of the silane coupling solvent (or the silane compound) and the solvent and the speed of withdrawal from the diluted solution (the rotational speed, in the case of a spin coating method). Generally, the film thickness is preferably 0.1 nm to 10 nm. After the coating step, the surface is heated by a heating device such as a heating furnace. It is preferable that the heating temperature is 110° C. to 160° C. (the temperature lower than the boiling point of the silane compound) by 10° C. to 20° C.) and the heating time is 15 minutes to 1 hour.

Figure 3:
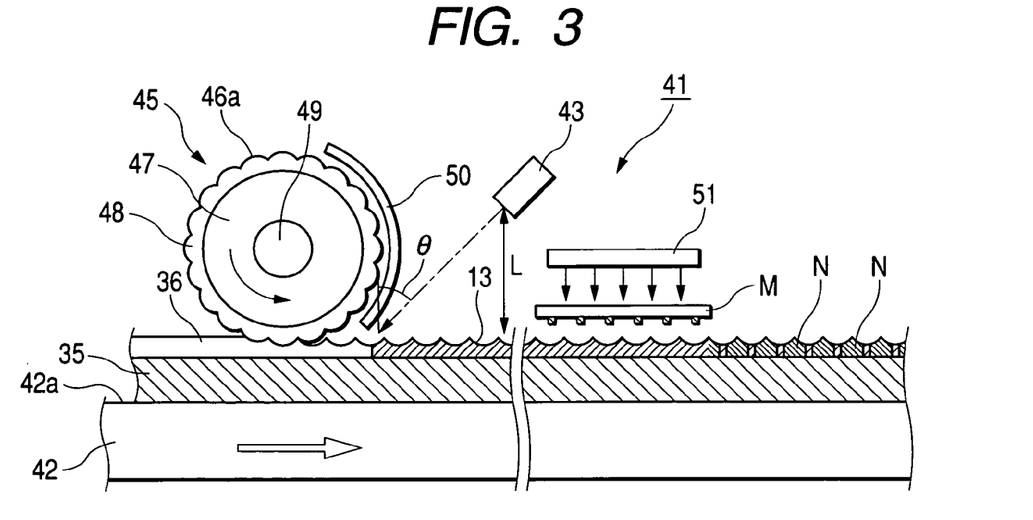
FIG. 3 is a side view showing a apparatus of manufacturing reflector used in the method of manufacturing the reflector according to the present invention.

FIG. 3 is a side view of the apparatus of manufacturing reflector used in the method of manufacturing the reflector according to the present embodiment. The apparatus of manufacturing reflector 41 comprises a base die 42 for supporting and carrying the sheet base body 35 in one direction, a transfer roller 45 rotatably arranged apart from the base die 42, an ultraviolet ray preliminary light source 43 arranged on the downstream side (the right side in Figure) in the direction of travel of the transfer roller 45 for preliminarily irradiating the ultraviolet rays onto the photosensitive resin layer 36.

The base die 42 can carry the sheet base body 35 laminated with the photosensitive resin layer 36 in the right side in Figure. Also, the base die 42 and the transfer roller 45 are spaced from each other and the sheet base body 35 having the photosensitive resin layer 36 can pass through between the base die and the transfer roller, and, upon passage, the transfer surface 46a of the transfer roller 45 is pressed against the photosensitive resin layer 36.

In addition, it is preferable that the base die surface 42a of the base die 42 serves as an ultraviolet ray absorbing surface. Specifically, it is preferable that the material of the base die surface 42a is composed of steel material for metallic mold on which Raydent treatment is performed. Thereby, most of preliminarily irradiated light of the ultraviolet ray transmitted through the photosensitive resin layer 36 and the sheet base body 35 is absorbed by the base die surface 42a, and thus is not reflected back to the photosensitive resin layer 36 again, thereby preventing the photosensitive resin layer 36 from being excessively cured due to the re-reflection of the ultraviolet rays.

Also, the speed of the sheet base body 35 as carried by the base die 42 is set in, for example, the range of 1 mm/sec to 15 mm/sec. In the rotating speed of the transfer roller 45, the moving speed of the transfer surface 46a is set to the range of 1 mm/sec to 15 mm/sec in correspondence with the carrying speed of the base die 42. If the carrying speed is less than 1 mm/sec, the ejected speed of the sheet base body 35 becomes decreased to degrade the productivity, and, if the carrying speed is more than 15 mm/sec, the transferring ability of the pattern for the photosensitive resin layer 36 is deteriorated.

Next, the ultraviolet ray preliminary light source 43 is positioned apart from the photosensitive resin layer 36 by a predetermined distance L. It is desirable that the distance L is in the range of 5 to 50 cm. Also, the direction of the ultraviolet rays emitted from the ultraviolet ray preliminary light source 43 is set to the direction inclined by an angle θ with respect to the direction perpendicular to the direction of travel of the sheet base body 35. It is desirable that the inclined angle is in the range of 0° to 50°. By irradiating the ultraviolet ray from the ultraviolet ray preliminary light source 43 at the inclined direction, it is possible that the ultraviolet ray can reach the photosensitive resin layer 36 immediately after being separated from the transfer roller 45.

If the distance L is more than 50 cm, the amount of the ultraviolet ray is lacking and thus the photosensitive resin layer is apt to be naturally changed, on the other hand, if the distance is less than 5 cm, the amount of the ultraviolet ray is excessive and thus the photosensitive resin layer is excessively cured. If the inclined angle θ is less than 10°, interference with the transfer roller 45 is apt to be generated or the ultraviolet ray cannot reach the photosensitive resin layer 36 immediately after being separated from the transfer roller 45. Also, if the inclined angle θ is more than 50°, the ultraviolet ray cannot be prevented from reaching the photosensitive resin layer 36 before the transferring step.

In addition, it is preferable that the preliminary irradiation amount of the ultraviolet ray is in the range less than and equal to 30 mJ/cm$^2$ per unit area of the photosensitive resin layer 36. If the amount of the ultraviolet rays is more than 30 mJ/cm$^2$, the surface of the photosensitive resin layer 36 become excessively hardened and the transferring ability is deteriorated. Also, if the ultraviolet ray is sufficiently strong, the photosensitive resin layer is completely cured and thus it is impossible to perform the post-process.

Also, it is preferable that the wavelength of the preliminarily irradiated ultraviolet ray is 300 nm or more. If the wavelength is less than 300 nm, the ultraviolet ray energy becomes increased and thus the photosensitive resin layer 36 is excessively cured or the resin begins to dissolve.

In addition, the apparatus of manufacturing reflector 41 comprises a light shield cover 50. The light shield cover 50 is located on the downstream side of the direction of travel of the transfer roller 45 to cover the peripheral surface 46 of the transfer roller 45. Thereby, the ultraviolet rays irradiated form the ultraviolet ray preliminary light source 43 are not leaked to the upstream side of the direction of travel of the transfer roller 45 and thus the photosensitive resin layer 36 can be prevented from being prematurely cured before performing the transferring step.

Next, the method of manufacturing the reflector using the above-mentioned apparatus of manufacturing reflector 41 will be explained. First, the sheet base body 35 shown in FIG. 1A or FIG. 1B is laid on the base die 42, and then the base die 42 is driven to carry the sheet base body 35 in one direction (the direction toward the right side from the left side in FIG. 3). The carried sheet base body 35 is inserted between the base die 42 and the transfer roller 45, and the transfer surface 46a of the transfer roller 45 is tightly pressed against the photosensitive resin layer 36. By tightly pressing the transfer surface 46a, the photosensitive resin layer 36 is formed with a plurality of concave portions 13 corresponding to the shape of the transfer surface 46a.

Next, with respect to the photosensitive resin layer 36 immediately after being released from the transfer roller 45 (immediately after the transferring step), the ultraviolet ray is preliminarily irradiated from the ultraviolet ray preliminary light source 43. By preliminarily irradiating the ultraviolet rays, only the surface layer of the photosensitive resin layer 36 is cured and the shape of the concave portion 13 is preserved.

Also, since the photosensitive resin layer 36 is insulated and the electroforming mold 48 forming the transfer surface 46a of the transfer roller 45 is conductive, the photosensitive resin layer 36 may be charged with static electricity by contacting with the transfer roller 45. In this case, as shown in FIG. 1B, if the photosensitive resin layer 36 is a layer 36' having electric charge, the static electricity is rapidly removed, a foreign substance is prevented from being attached, and the electrostatic discharge is prevented.

Figure 4:
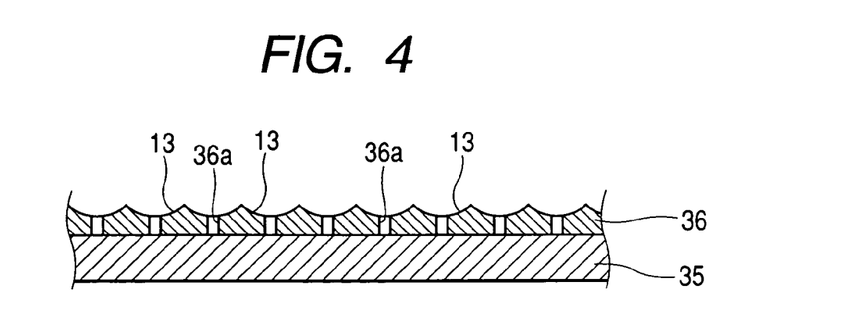
FIG. 4 is a cross-sectional view showing the photosensitive resin layer made by the method of manufacturing the reflector according to the present invention.

Next, as shown in FIG. 3, with respect to the preliminarily irradiated photosensitive resin layer 36, the main irradiation of the ultraviolet ray is performed by the light from the ultraviolet ray main-irradiating source 51 positioned on the downstream side of the ultraviolet ray preliminary irradiating source 43, using a photomask M having a predetermined pattern. By this main irradiation, the portion that is not shielded by the mask M in the photosensitive resin layer 36 is completely cured and the portion covered by the shielding pattern of the mask M remains in the non-cure state (the non-cure portion N). Subsequently, it is developed by developing solution during 45 seconds to 1 minute, and then is rinsed to remove the non-cure portion N. Thereafter, it is baked at a temperature of 220 to 240°C. Thereby, as shown in FIG. 4, the photosensitive resin layer 36 can be formed with fine holes 36a. In the non-cure portion N formed by the shielding portion of the mask M, only the surface layer is cured by the preliminary irradiation, and thus the non-cure portion N can be easily removed by the development according to the developer and by the rinse according to the rinse solution.

Figure 5:
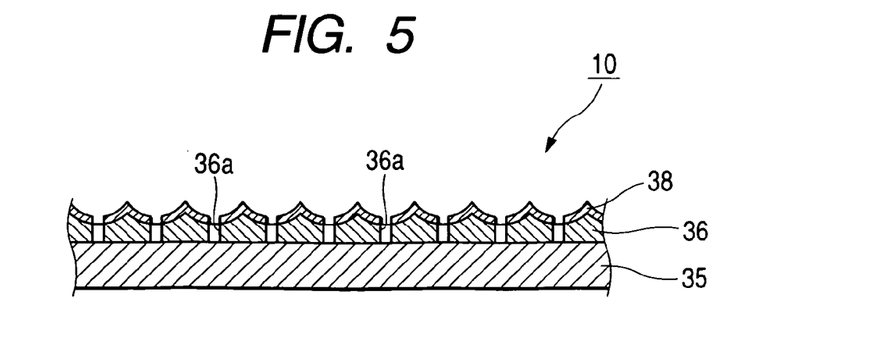
FIG. 5 is a cross-sectional view showing the reflector made by the method of manufacturing the reflector according to the present invention.

Finally, a reflective film 38 such as a Al film is formed on the photosensitive resin layer 36 and a photolithography step is performed using a mask having a predetermined pattern, thereby obtaining the reflector 10 having the concave portions 13 at the surface thereof and formed with the fine holes 36a for transmitting the light, as shown in FIG. 5.

It is preferable that the intensity of the ultraviolet ray upon performing the main-irradiation is in the range of 100 to 520 mJ/cm$^2$. If the intensity of the ultraviolet ray is less than 100 mJ/cm$^2$, the film thickness of the photosensitive resin layer 36 is reduced, and, if the strength of the ultraviolet ray is more 520 mJ/cm$^2$, the matching effect cannot be obtained.

According to the method of manufacturing the reflector, by preliminarily irradiating the ultraviolet ray with respect to the photosensitive resin layer 36 immediately after the transferring step, only the surface of the photosensitive resin layer 36 is cured, thereby preventing the photosensitive resin layer 36 from being naturally changed during the period from the preliminary irradiating step to the main irradiating step. Also, since the photosensitive resin layer 36 after the preliminary irradiating step is not completely cured, the fine holes 36a for transmitting the light are easily formed.

Also, since the preliminary irradiation amount of the ultraviolet ray does not exceed 30 mJ/cm$^2$ per unit area of the photosensitive resin layer 36, only the surface of the photosensitive resin layer 36 is cured and thus the post-process for the photosensitive resin layer 36 become easy.

In addition, since the preliminary irradiating step of the ultraviolet ray is performed from the direction inclined by 0° to 50° with respect to the direction perpendicular to the direction of travel of the sheet base body 35 at the location spaced by 5 cm to 50 cm from the photosensitive resin layer 36, the ultraviolet ray can reach the surface of the photosensitive resin layer 36 immediately after releasing the transfer roller 45, thereby preventing the photosensitive resin layer 36 from being naturally changed. Also, since the photosensitive resin layer 36 is formed by any one of acryl-based resist, polystyrene-based resist, azide rubber-based resist, and imide-based resist, only the surface of the photosensitive resin layer 36 is cured by the amount of ultraviolet ray equal to or less than 30 mJ/cm$^2$ per unit area, thereby preventing the photosensitive resin layer from being naturally changed in accordance wit the elapsed time.

Figure 6:
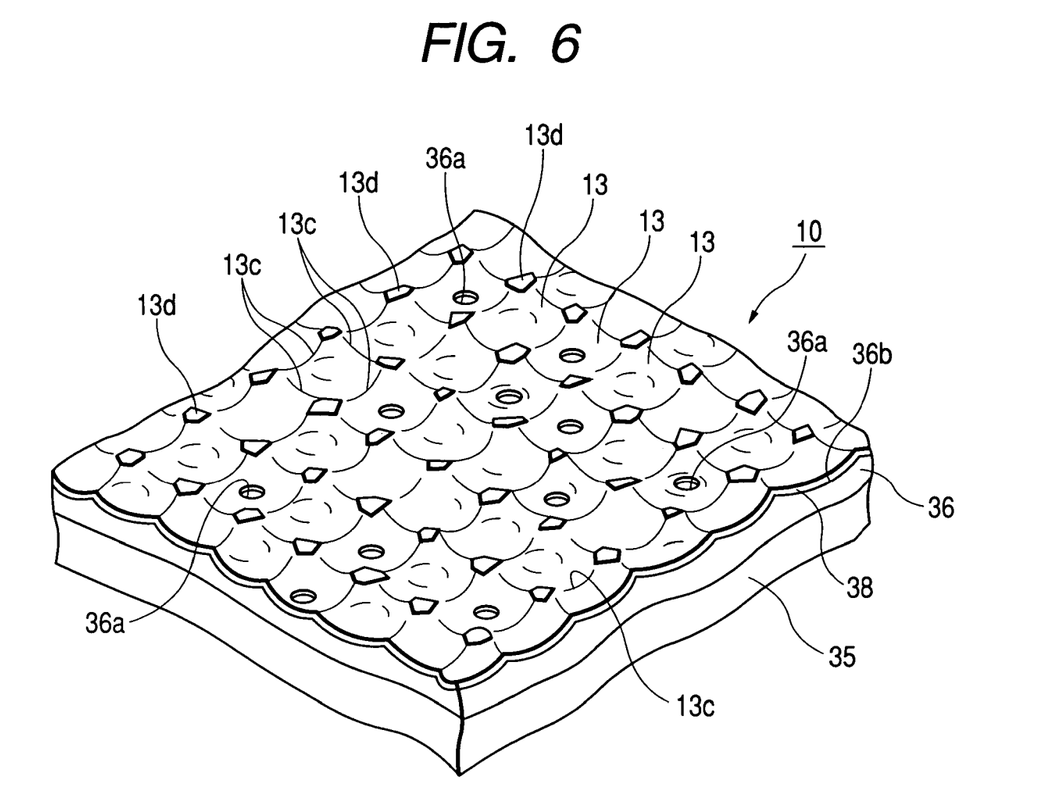
FIG. 6 is a partial perspective view of the reflector shown in FIG. 5.
Figure 7A:
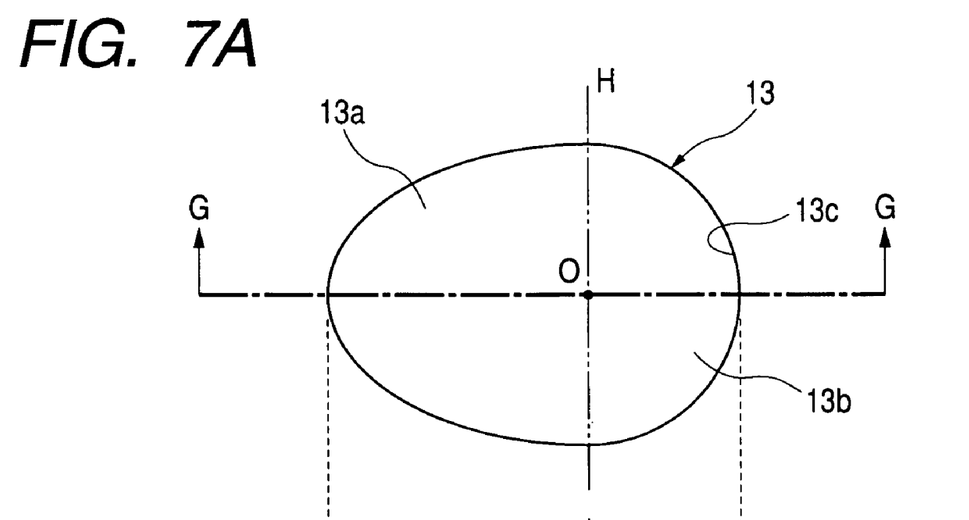
FIG. 7A is a plan view thereof and FIG. 7B is a cross-sectional view thereof.
Figure 7B:
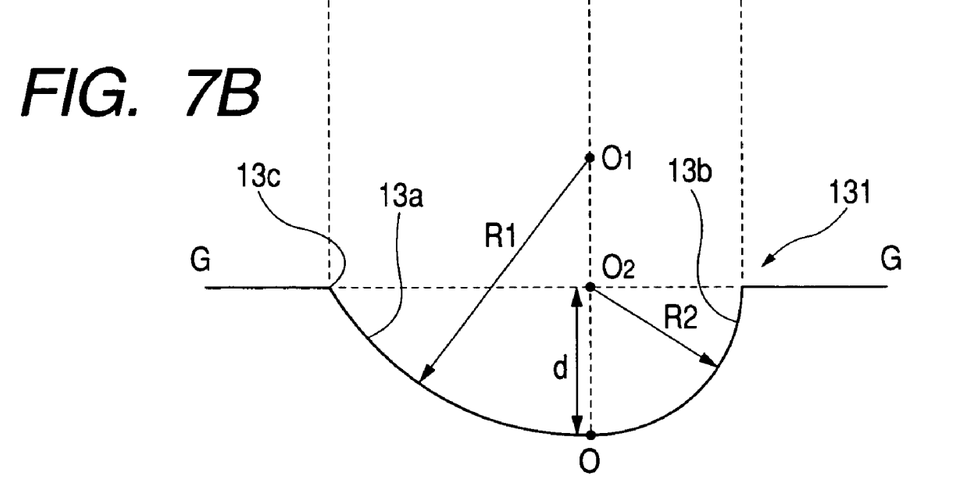

FIG. 6 is a partial perspective view of the reflector 10 shown in FIG. 5. Also, the FIG. 7A is a plan view of the concave portion formed in the reflector of FIG. 6, and FIG. 7B is a cross-sectional view corresponding to line G-G of FIG. 7A.

The reflector 10 shown in FIG. 6 is comprised of the sheet base body 35, the cured photosensitive resin layer 36 and the reflective film 38. The surface 36b of the photosensitive resin layer is formed with a plurality of the concave portions 13, and reflectivity is obtained by the reflective film 38 formed on the concave portions 13. Also, the reflective film 38 is formed by depositing Al or Ag, it is preferable that the film thickness thereof is in the range of 0.05 to 0.2 μm, and it is more preferable that the film thickness thereof is in the range of 0.08 to 0.15 μm. If the film thickness of the reflective film 38 is less than 0.05 μm, the reflectivity is deteriorated, and, if the film thickness of the reflective film is more than 0.2 μm, the cost required for forming the film becomes excessive or the unevenness due to the concave portions 13 becomes decreased.

As mentioned above, the concave portions 13 is formed by performing the transfer process on the photosensitive resin layer 36, and the contours 13c of the concave portions 13 are adjacent to each other, as shown in FIG. 6. The adjoined portion between the contour 13c has a peaked shape, that is, the shape which the inclination is discontinuous, the area of the flat portion 13d between the concave portions 13 is small. By having this shape, the diffuse reflection is good as non-Gaussian distribution type for the light-receiving angle.

Also, the photosensitive resin layer 36 is formed with a plurality of fine holes 36a, the fine holes 36a are opened in the surface of the reflective film 38. By providing the fine holes 36a, the light from the back light can be transmitted in the transmitting mode.

In addition, as shown in FIGS. 7A and 7B, the inner surface of the concave portion 13 has a first curve 13a and a second curve 13b that are portions of two spherical surface each having different radius, the centers $O_1$, $O_2$ of the curves 13a, 13b are positioned on the normal line of the deepest point O of the concave portion 13, the first curve 13a becomes a portion of the spherical surface of the radius R1 centered on the $O_1$, and the second curve 13b becomes a portion of spherical surface of the radius R2 centered on the $O_2$. And, in the plan view shown in FIG. 7A, in the vicinity of the straight H passing through the deepest point O of the concave portion 13 and being perpendicular to the line G-G, the first curve 13a and the second curve 13b are divided. The depth of the concave portion 13 is about 0.3 to 2.0 μm.

Figure 8:
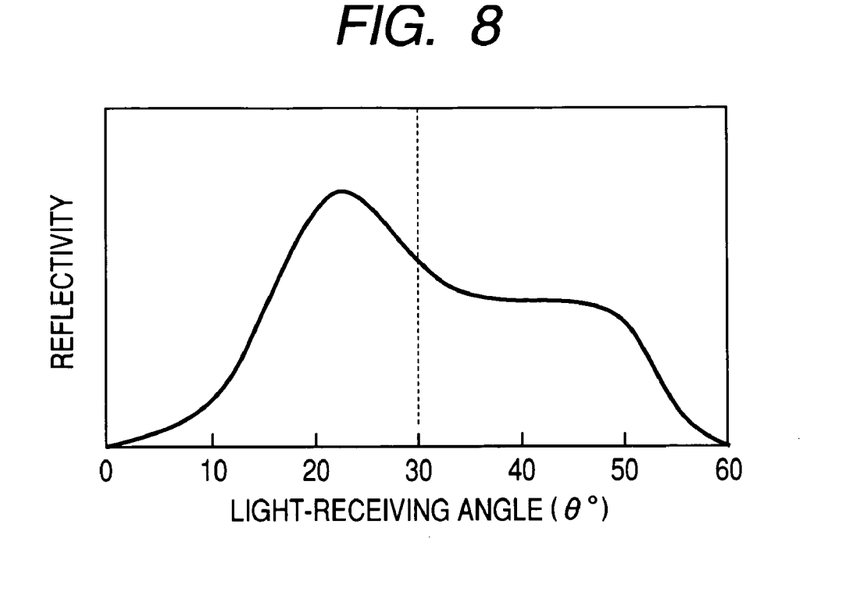
FIG. 8 shows reflection characteristics of the reflector shown in FIGS. 5 and 6 and is a graph showing the relationship between the reflectivity and the light-receiving angle.

FIG. 8 shows a graph showing the result that the reflectivity (%) of the reflector 10 is measured by irradiating the light by an incident angle of 30° from the right side in FIG. 7 and changing the light-receiving angle in the range of ±30° (0° to 60°; 0° corresponds to the normal direction of one surface of the reflector) on the basis of 30° that is specular direction for the reflective surface.

As shown in this Figure, according to the reflector 10 comprising the above-mentioned compositions, since the absolute value of the inclined angle of the second curve 13b composed of the spherical surface having the relatively small radius is relatively large, the reflected light is diffused in a wide angle and thus high reflectivity can be obtained in the wide light-receiving angle range of about 15° to 50°. Since the reflected light is diffused in a particular direction narrower than that of the second curve 13b by the reflection of the first curve 13a composed of the spherical surface having the relatively large radius, the reflectivity becomes a maximum value at an angle smaller than 30° that is the specular direction and thus the reflectivity near the peak also becomes increased. At the result, since the peak of the light incident to and reflected from the reflector 10 is shifted to the side closer to the normal direction of the reflector 10 than the specular direction, the reflective brightness in the front direction of the reflector 10 can be increased. Accordingly, for example, if the reflector 10 according to the present embodiment is adapted to the reflective layer of the liquid crystal display device, the reflective brightness in the front direction of the liquid crystal display device can be improved. Thereby, the brightness in the viewer direction of the liquid crystal display device can be increased.

Figure 9:
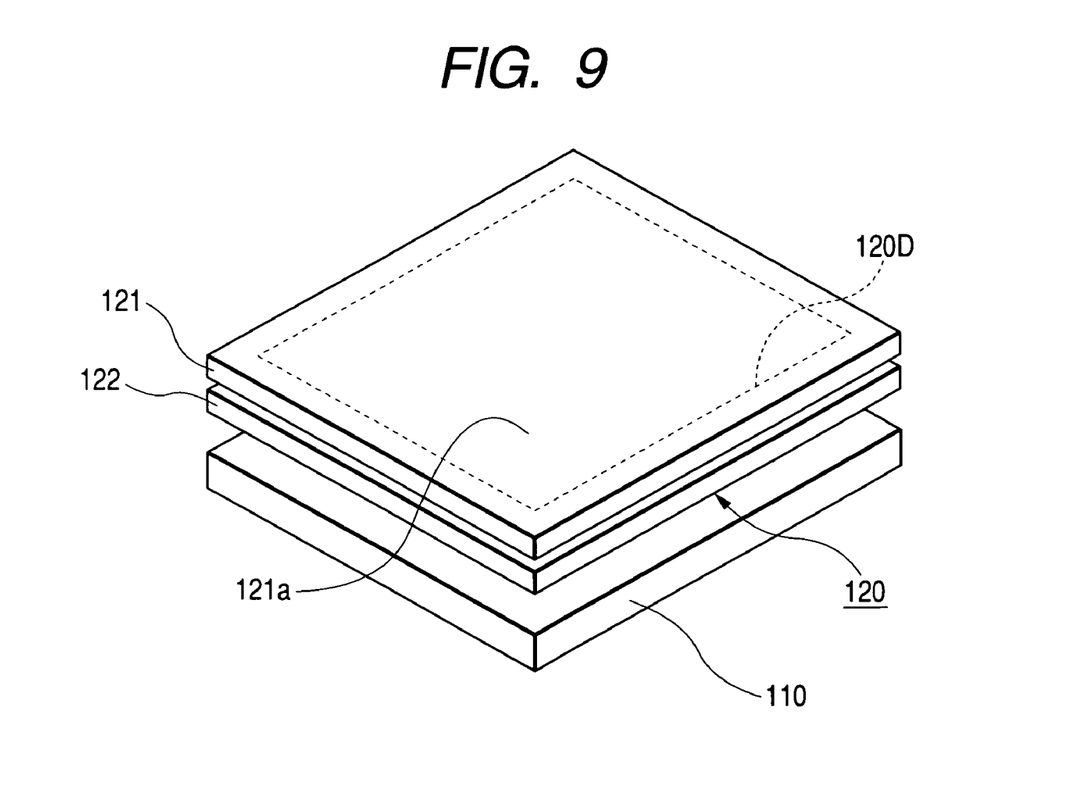
FIG. 9 is an exploded perspective view of a liquid crystal display device comprising the reflector shown in FIGS. 5 and 6.
Figure 10:
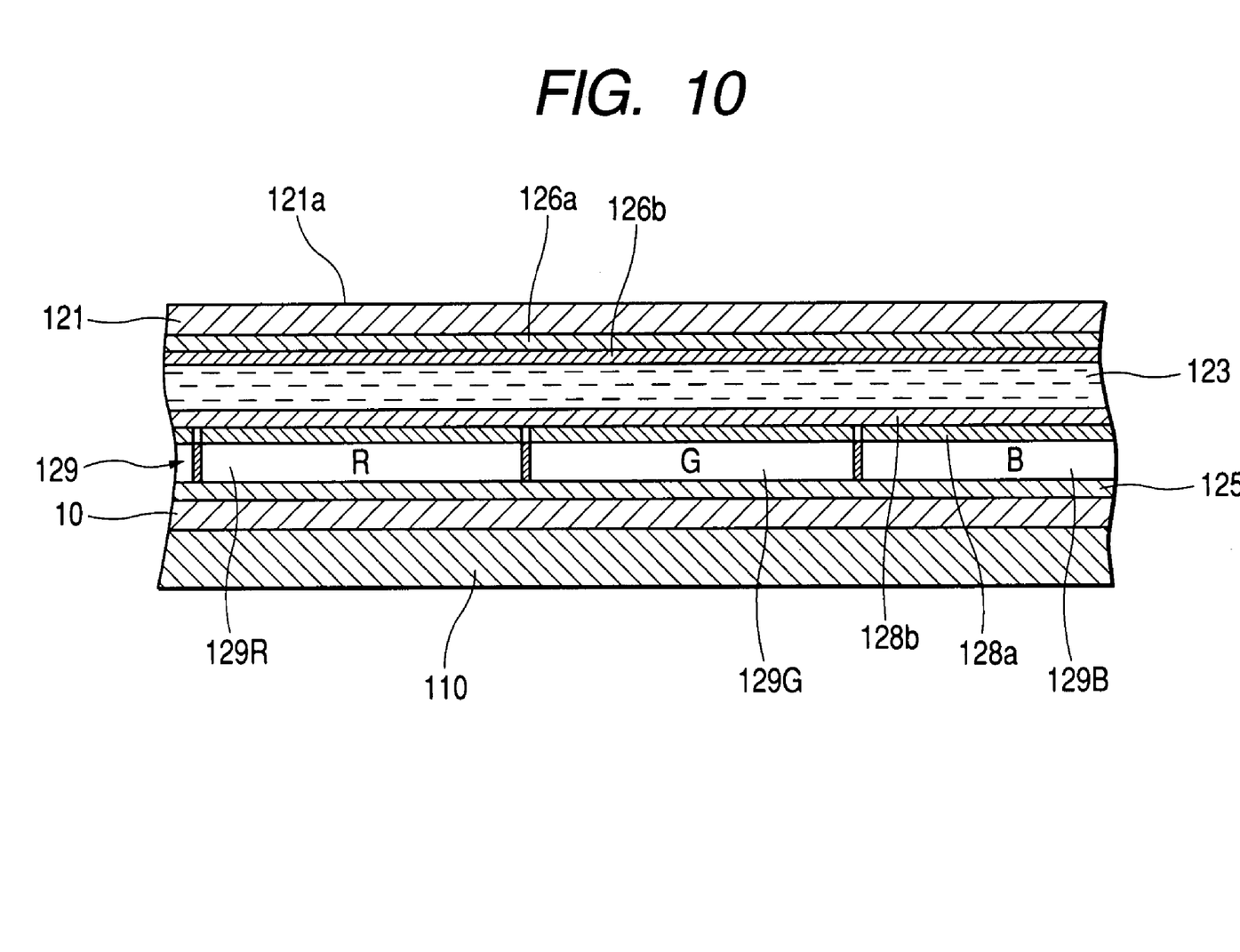
FIG. 10 is a cross-sectional view of the liquid crystal display device shown in FIG. 9.

FIG. 9 is a perspective view of a liquid crystal display device comprising the above-mentioned reflector 10, and FIG. 10 is a partial cross-sectional view of FIG. 9. The liquid crystal display device shown in FIGS. 9 and 10 comprises a back light 110, and a semi-transmissive liquid crystal panel 120 positioned at the front side (upper side in Figure) of the back light 110.

The liquid crystal panel 120 comprises an upper substrate 121 having a display surface 121a and a lower substrate 122 facing to each other, a rectangular area 120D shown in a dotted line in FIG. 9 becomes a display area of the liquid crystal panel 120, and the display area 120d is actually arranged with pixels of the liquid crystal panel in a matrix shape. Also, back light 110 is provided at lower side of the display area of the liquid crystal panel 120. In a dark point which external light is not obtained, the back light 110 is switched on to emit the light toward the liquid crystal panel 120 and thus the liquid crystal panel 120 is illuminated.

Also, the liquid crystal panel 120 is a reflective passive matrix liquid crystal panel capable of implementing color display, and is comprised by inserting a liquid crystal layer 123 between the upper substrate 121 and the lower substrate 122 facing to each other, as shown FIG. 10. The inner surface of the upper substrate 121 is mounted with a plurality of transparent electrodes 126a having a rectangular shape in the plane extended in the horizontal direction and an alignment film 126b formed on the transparent electrode 126a, and the inner surface of the lower substrate 122 is formed with a color filter layer 129, a plurality of transparent electrodes 128a having a rectangular shape in the plan view, and an alignment film 128b in order. Also, the outer surface of the lower substrate 122 is mounted with the reflector 10.

Both the transparent electrode 126a of the upper substrate 121 and the transparent electrode 128a of the lower surface 122 have a rectangular-shaped plane and are arranged in a stripe shape in the plan view. Also, the extended direction of the transparent electrode 126a is perpendicular to the extended direction of the transparent electrode 128a in the plan view. Accordingly, one dot of the liquid crystal panel 120 is formed at the crossing location of one transparent electrode 126a and one transparent electrode 128a, a color filter having one color among the below-mentioned color filters having three colors (red, green, blue) is positioned in correspondence with each dot. And, 3 dots of R (red), G (green) and B (blue) form one pixel of the liquid crystal panel 120.

In the color filter layer 129, each of color filters 129R, 129G, 129B of red, green and blue is periodically arranged, each color filter is formed at the lower side of the corresponding transparent electrode 128a, and a set of the color filters 129R, 129G, 129B is positioned at every pixel 120c. And, by driving and controlling the electrode corresponding to each of the color filters 129R, 129G, 129B, the displayed color of the pixel 120c is controlled.

Next, as shown in FIG. 10, the reflector 10 positioned at the outer side of the lower substrate 122 includes the configurations shown in the perspective view of FIG. 6. That is, the reflector includes the reflective film 38 and the photosensitive resin layer 36 for applying a predetermined surface shape to the reflective film 38, as shown in FIG. 6. The photosensitive resin layer 36 is provided with a plurality of fine holes 36a. The surface of the photosensitive resin layer 36 is provided with a plurality of concave portions 13, and desired reflectivity is obtained by the reflective film 38 formed on the concave portions 13. Accordingly, since the concave portion 13 of the reflector 10 of this liquid crystal display device has the shape shown in FIG. 7 and the reflective characteristics shown in FIG. 8, the reflective display having high brightness can be performed in a wide angle range and the peak of the reflective brightness is more shifted to the normal direction of the panel than the specular direction, thereby increasing the brightness of the front side of the panel in the viewer direction of the liquid crystal display device and then substantially obtaining the bright display.

Also, since the photosensitive resin layer 36 is provided with a plurality of fine holes 36a, the light irradiated from the back light 110 onto the reflector 10 can be transmitted to the side of the liquid crystal display panel 120 through these fine holes 36a. In addition, the light incident from the side of the display area 120D is reflected by the reflective film 12. Like this, the liquid crystal display device according to the present embodiment can be used as the semi-transmissive liquid crystal display device.

The photosensitive resin layer 36 included in the liquid crystal panel 120 can easily and repeatedly manufactured by the above-mentioned method of manufacturing the reflector. In addition, according to this manufacturing method, the arranged direction of the prominence and depression pattern of the reflective surface can be optionally changed by changing the shape of the transfer mold. Also, by adapting the above-mentioned manufacturing method, although the variation is generated in the pitch of the color filter layer 129, or the electrodes 26a, 28a, the arranged pattern of the prominence and depression of the reflector 10 can be easily changed, and thus the moiré fringes can be efficiently prevented from being generated.

EMBODIMENT

Hereinafter, the method of manufacturing the reflector according to the embodiment will be described in detail.

On the sheet base body, the photosensitive resin layer having a thickness of 3 μm and composed of acryl-based resist was formed. This sheet base body was laid on the base die of the apparatus of manufacturing reflector shown in FIG. 3 and was inserted between the base die and the transfer roller while carrying the sheet base body at a carrying speed of 10 mm/sec. And, by tightly pressing the transfer roller against the photosensitive resin layer, a plurality of concave portions corresponding to the shape of the transfer surface of the transfer roller were formed in the photosensitive resin layer. And then, the ultraviolet ray of 5 to 30 mJ/$cm^2$ is preliminarily irradiated onto the photosensitive resin layer immediately after being released from the transfer roller.

After the photosensitive resin layer was subjected to the preliminary irradiation for 10 minutes, a mask layer was laminated on the photosensitive resin layer and the ultraviolet ray of 520 mJ/$cm^2$ is main-irradiated. Next, after it was developed by developer for 60 seconds, it was rinsed by pure water to remove the mask layer and the non-cured portion. Thereafter, it is post-baked at 230° C. during 60 minutes. Thereby, the photosensitive resin layer having a plurality of the concave portions and a plurality of the fine holes was formed.

Figure 11:
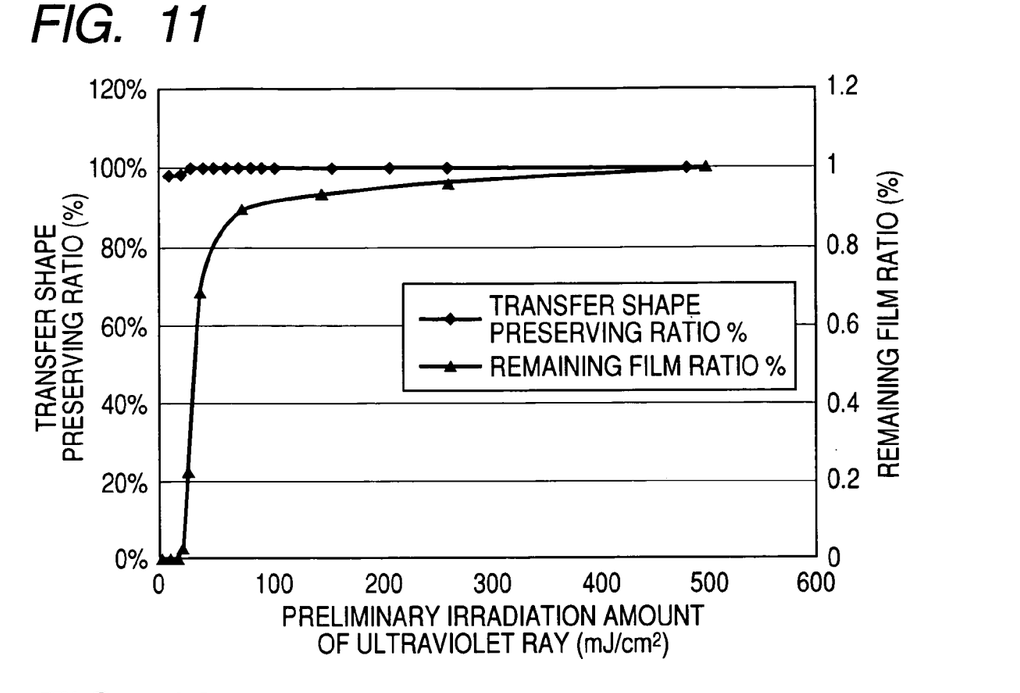
FIG. 11 is a graph showing the relationship between transfer shape preserving ratio and remaining film ratio, and preliminary ultraviolet ray irradiation intensity.
Figure 12:
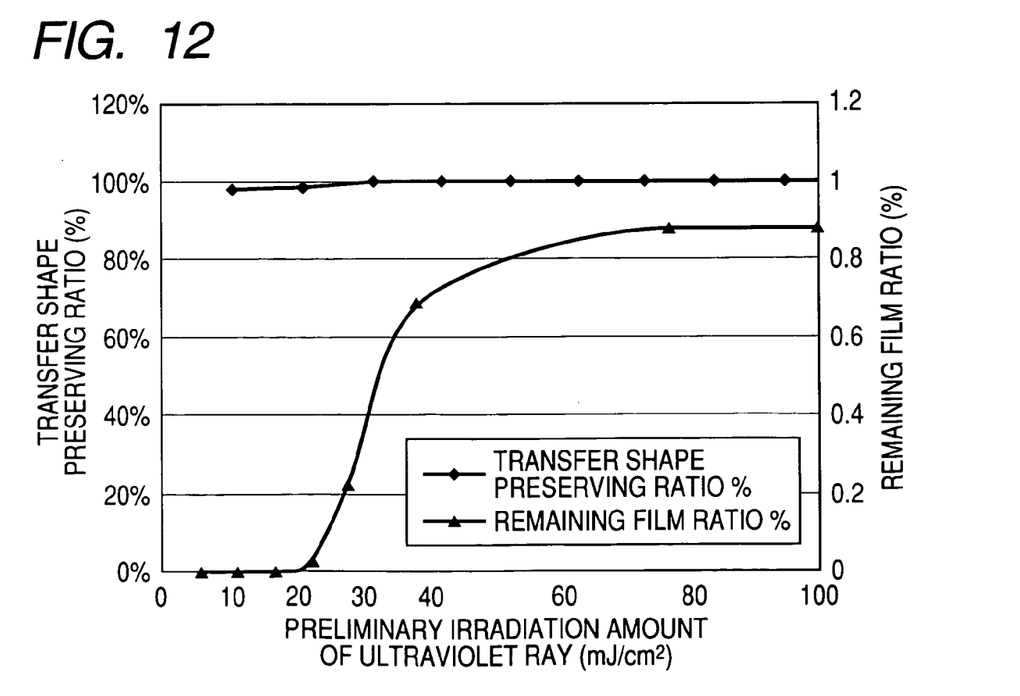
FIG. 12 is a partial enlarged diagram of FIG. 11 and is a graph enlarging the preliminary ultraviolet ray irradiation intensity within the range of 1 to 100 mJ/cm$^2$.

With respect to the obtained photosensitive resin layer, the relationship between the transfer shape preserving ratio and the remaining film ratio, and the ultraviolet ray preliminary irradiation intensity was examined. The result is shown in FIGS. 11 and 12. FIG. 12 is a partial enlarged view and is a graph enlarging the range of 1 to 100 mJ/$cm^2$ in the ultraviolet preliminary irradiation intensity. Also, the transfer shape preserving ratio is defined by (the depth of the transfer shape in each condition)/(the depth of the transfer shape when the preliminary irradiation amount is 520 mJ/cm$^2$). Also, the remaining film ratio presents the ratio of the photosensitive resin layer left in the fine hole based on the non-cured portion shielded by the mask layer, and the remaining film ratio of 0% means that the photosensitive resin layer is not left in the fine hole.

As shown in FIGS. 11 and 12, it is seen that the more preliminary irradiation intensity is increased, the more increased the remaining film ratio becomes. Also, it is seen that the transfer shape preserving ratio has relatively high value though the preliminary irradiation intensity is 5 mJ/cm$^2$. From the result shown in FIGS. 11 and 12, it is seen that when the preliminary irradiation strength is 30 mJ/cm$^2$ or less, the remaining film ratio becomes 0.4% or less, and, when the preliminary irradiation ratio is 20 mJ/cm$^2$ or less, the remaining film ratio becomes substantially 0%.

Also, in the above-mentioned embodiment, although the transferring step is performed, under the state of fixing the transfer roller, while carrying the photosensitive resin layer, the present invention is not limited to this, and the transferring step may be performed, while carrying the transfer roller on the photosensitive resin layer which is in fixed state.

As mentioned above, according to the method of manufacturing the reflector of the present invention, only the surface of the photosensitive resin layer can be cured by preliminarily irradiating the ultraviolet ray with respect to the photosensitive resin layer immediately after the transferring step, thereby preventing the photosensitive resin layer from being changed during the period from the preliminary irradiating step to the main irradiating step. In addition, since the photosensitive resin layer is not completely cured, the post-process such as the step of forming the fine hole for transmitting the light can be easily performed.

What is claimed is:

1. A method of manufacturing a reflector, comprising the steps of:

forming a photosensitive resin layer on a sheet base body;

transferring a prominence and depression pattern onto said photosensitive resin layer, while forwarding the sheet base body in one direction, by rotating a transfer roller having substantially cylindrical shape while pressing the transfer roller against said photosensitive resin layer, the transfer roller having a transfer surface having a prominence and depression pattern at a periphery thereof;

preliminarily irradiating ultraviolet ray with respect to said photosensitive resin layer immediately after said transferring step, wherein said preliminary irradiation step does not completely cure said photosensitive resin layer; and main-irradiating the ultraviolet ray with respect to said photosensitive resin layer after said preliminary irradiating step, wherein the main irradiation step performs irradiation via a photomask to form holes in said photosensitive resin layer.

2. The method of manufacturing a reflector according to claim 1, wherein the preliminary irradiation amount of said ultraviolet ray does not exceed 30 mJ/cm$^2$ per unit area of said sheet base body.

3. The method of manufacturing a reflector according to claim 1, wherein said preliminarily irradiating step is performed from a location spaced by 5 to 50 cm from said photosensitive resin layer toward a direction inclined by 0° to 50° with respect to a direction perpendicular to a direction of travel of the transfer roller.

4. The method of manufacturing a reflector according to claim 1, wherein said photosensitive resin layer is composed of any one of acryl-based resist, polystyrene-based resist, azide rubber-based resist, and imide-based resist.

5. The method of manufacturing a reflector according to claim 1, further comprising the step of providing an antistatic layer to said photosensitive resin layer before the transferring step.

* * * * *